(12) United States Patent
Buchberger et al.

(10) Patent No.: US 6,407,332 B1
(45) Date of Patent: Jun. 18, 2002

(54) CABINET FOR RECEIVING ELECTRONIC SUB-ASSEMBLY AND DISTRIBUTION COMPONENTS

(75) Inventors: Georg Buchberger, Munich; Heinz-Juergen Niggl, Pöcking; Stefan Schwind, Olching, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/936,837
(22) PCT Filed: Mar. 15, 2000
(86) PCT No.: PCT/DE00/00806
§ 371 (c)(1), (2), (4) Date: Nov. 20, 2001
(87) PCT Pub. No.: WO00/57523
PCT Pub. Date: Sep. 28, 2000

(30) Foreign Application Priority Data

Mar. 18, 1999 (DE) ..................................... 299 04 992 U

(51) Int. Cl.⁷ ................................................. H01J 15/00
(52) U.S. Cl. ........................... 174/50; 174/58; 361/826; 312/223.6
(58) Field of Search ............................... 174/50, 48, 58; 220/4.02, 3.6, 3.8; 361/826, 829; 312/223.6, 223.3, 194, 265.1; 108/50.02

(56) References Cited

U.S. PATENT DOCUMENTS

| | | | | |
|---|---|---|---|---|
| 3,265,419 A | * | 8/1966 | Durnbaush et al. | 312/265.1 X |
| 5,357,874 A | * | 10/1994 | Palmer | 312/223.6 X |
| 5,488,543 A | * | 6/1996 | Mazura et al. | 361/829 |
| 5,761,797 A | * | 6/1998 | Besserer et al. | 361/829 X |
| 6,327,983 B1 | * | 12/2001 | Cronk et al. | 108/50.02 |

FOREIGN PATENT DOCUMENTS

| | | |
|---|---|---|
| DE | 297 09 227 U | 7/1997 |
| DE | 297 11 262 U | 9/1997 |
| FR | 2 711 036 A | 4/1995 |

* cited by examiner

Primary Examiner—Anthony Dinkins
Assistant Examiner—Dhiru R Patel
(74) Attorney, Agent, or Firm—Staas & Halsey LLP

(57) ABSTRACT

The cabinet has four upright supports, which are connected to one another at the top and bottom in each case, for fixing the subassemblies and distribution components, the upright supports each having a comb-like limb that points obliquely outward and whose outer edge in each case forms an edge of the cabinet.

5 Claims, 5 Drawing Sheets

CABINET FOR RECEIVING ELECTRONIC SUB-ASSEMBLY AND DISTRIBUTION COMPONENTS

CROSS REFERENCE TO RELATED APPLICATIONS

This application is based on and hereby claims priority to PCT Application No. PCT/DE00/00806 filed on Mar. 15, 2000 and German Application No. 299 04 992.2 filed on Mar. 18, 1999 in Germany, the contents of which are hereby incorporated by reference.

BACKGROUND OF THE INVENTION

The present invention relates to a cabinet for accommodating electronic subassemblies and distribution components.

SUMMARY OF THE INVENTION

It is one potential object of the invention to specify a cabinet which can be produced easily and cost-effectively.

In order to achieve this object, the cabinet may have four upright supports, which are connected to each other at the top and bottom in each case, for fixing the subassemblies and distribution components, the upright supports each having a comb-like limb that points obliquely outward and whose outer edge in each case forms an edge of the cabinet.

The cabinet has only a few components which are simple to produce and which can be joined together easily.

One advantageous refinement of the cabinet is characterized in that the cross section of the cabinet is square. In this way, the same add-on parts, such as doors, accessories, etc., can be used all round.

As a result of the four supports, the installation of low and relatively heavy internal fittings is also easily possible. The simplest sections can be selected for the supports. The comb-like, outwardly pointing limbs mean that wiring is possible without threading between the individual internal components.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
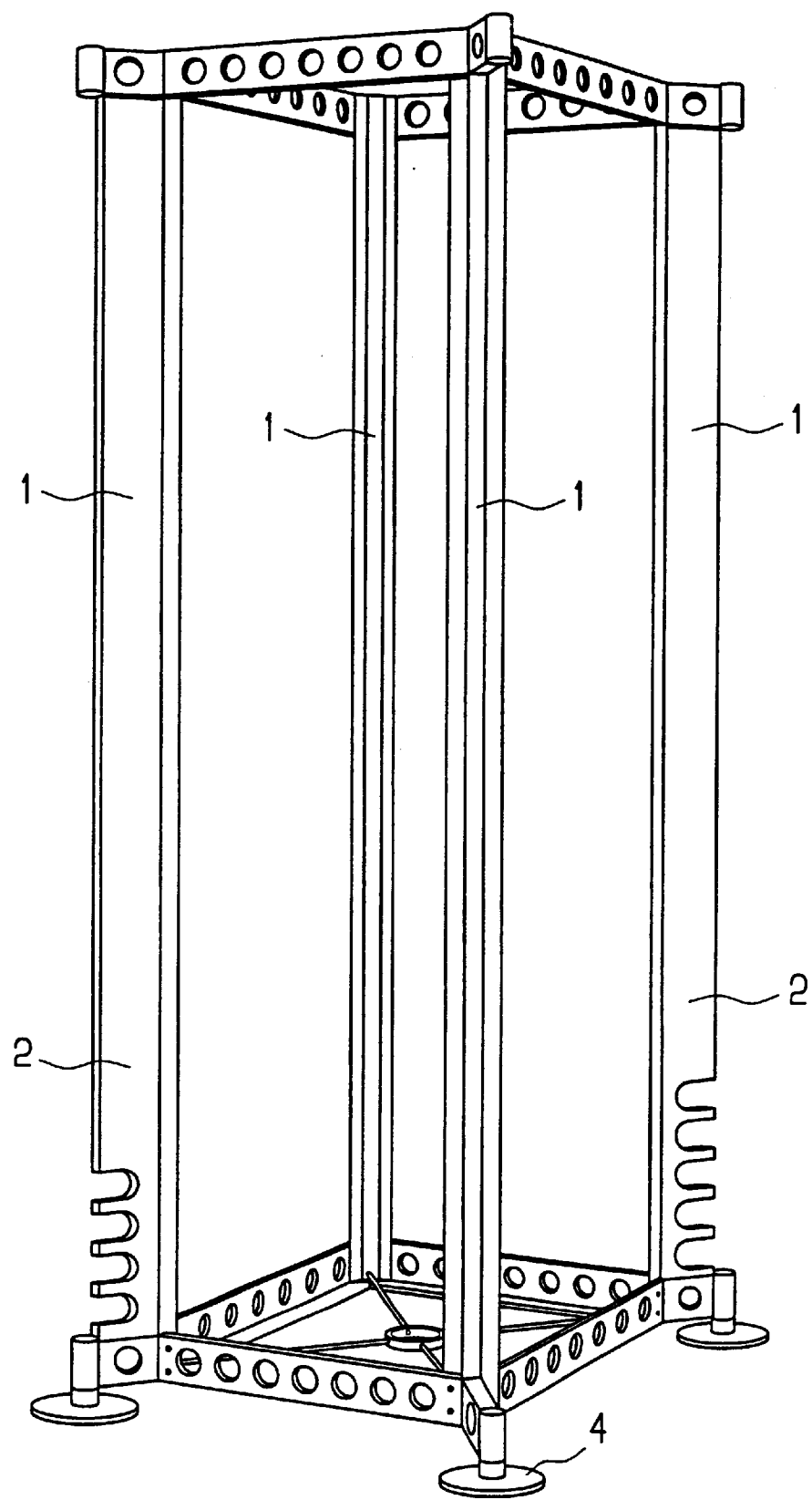
FIG. 1 shows a perspective view of a cabinet according to the invention.
Figure 2:
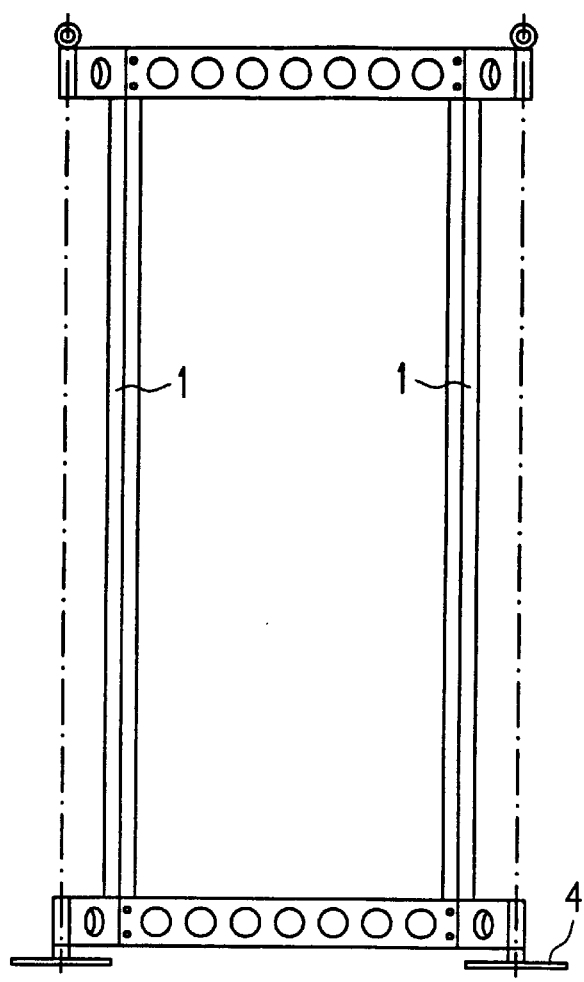
FIG. 2 shows a side view of the cabinet illustrated in FIG. 1.
Figure 3:
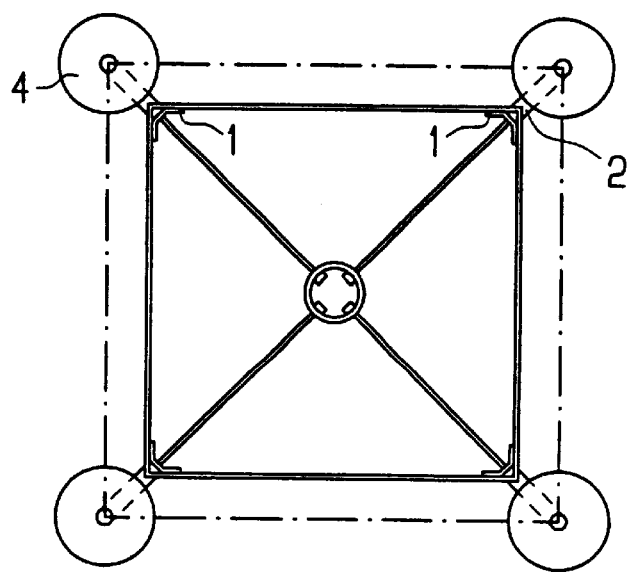
FIG. 3 shows a schematic plan view of the cabinet illustrated in FIG. 1.

Reference will now be made in detail to the preferred embodiments of the present invention, examples of which are illustrated in the accompanying drawings, wherein like reference numerals refer to like elements throughout.

The cabinet shown in FIG. 1 has four supports 1 having the comb-like limbs 2. The supports 1 are firmly connected to one another at the top and bottom.

The supports 1 have an extremely simple section, which are used to fix the electronic subassemblies or to fix distribution components. Smaller subassemblies can in each case be fixed to two supports 1, at the front and rear. However, because of the four supports, there is also the possibility of accommodating low and relatively heavy internal fittings in the cabinet without problems. For the purpose of fixing, self-tapping screws can be used, which at the same time ensures good grounding of the internal fittings A square cross section of the cabinet is particularly advantageous, since in this way the same add-on parts can be used all round.

Figure 4:
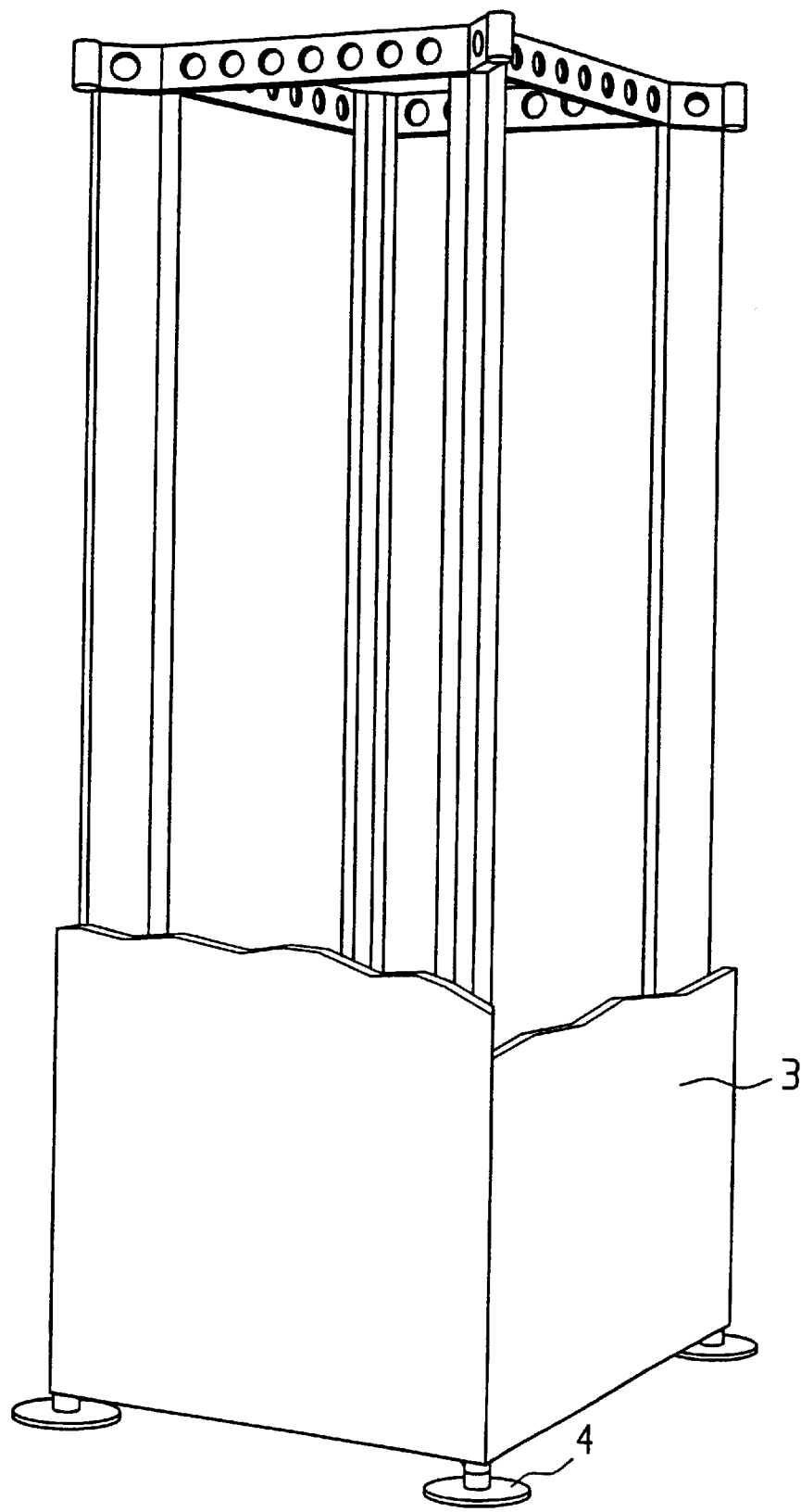
FIG. 4 shows a perspective illustration of the cabinet according to the invention, in which the use of doors is indicated.

The cabinet may be clad with the aid of doors 3, as indicated in FIG. 4. However, there is also the possibility of using the cabinet in naked form. It is particularly advantageous to place the cabinet on foot plates which are constructed on the disk-spring principle.

Figure 5:
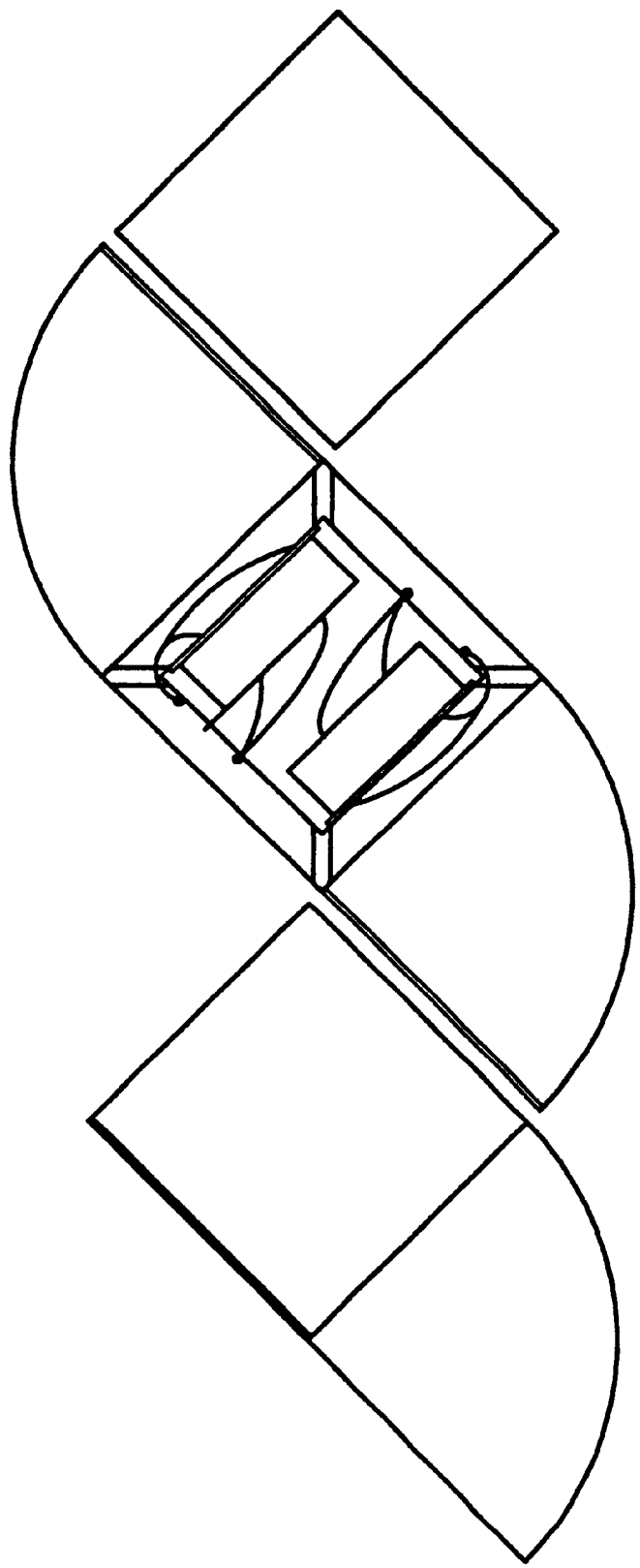
FIG. 5 shows possible ways of erecting a plurality of cabinets according to the invention.
Figure 6:
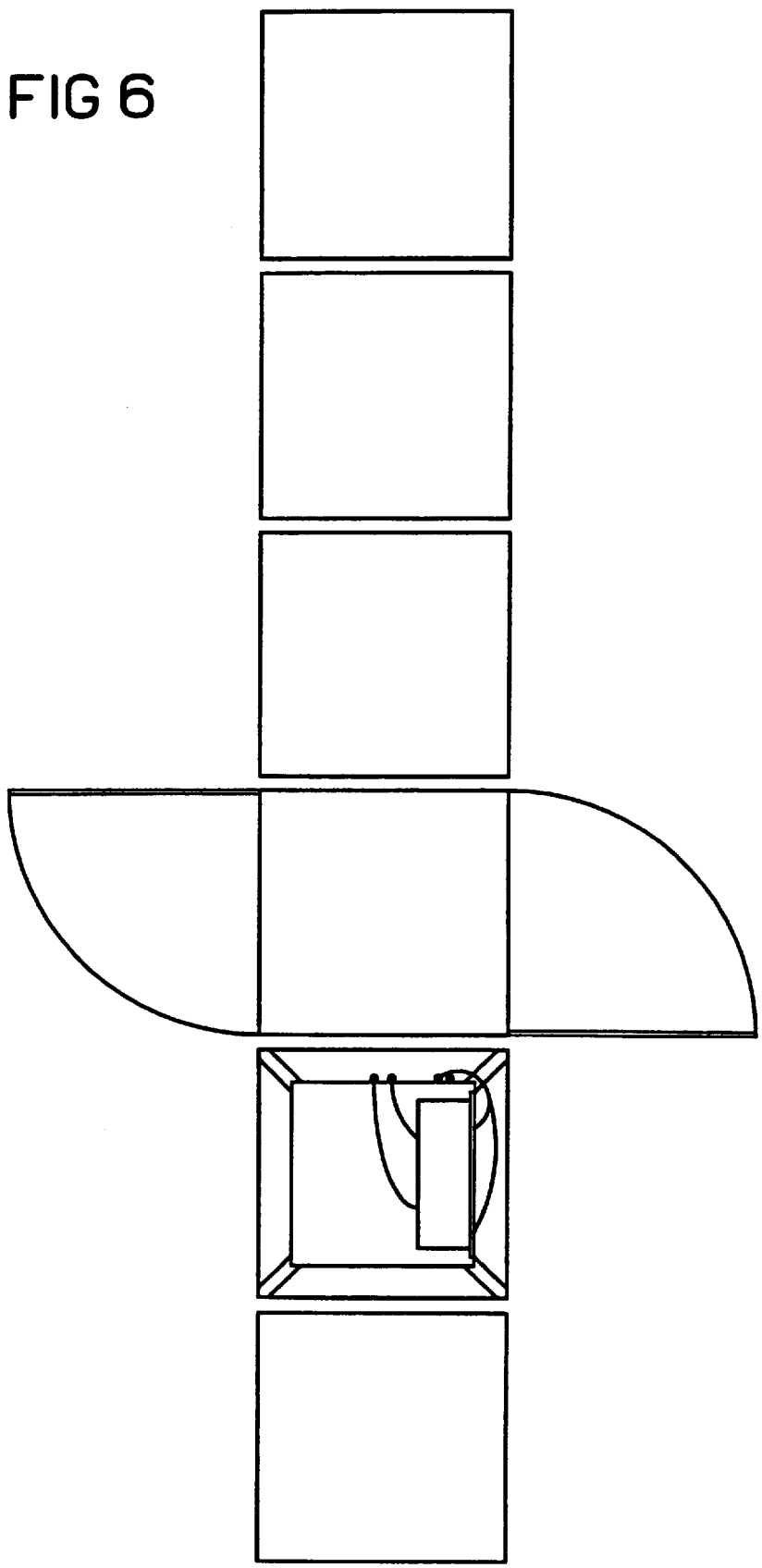
FIG. 6 shows an arrangement of a plurality of cabinets according to the invention, in which each cabinet is accessible only from two sides.

The cabinet is accessible from all sides, so that there are a plurality of possibilities of arranging a plurality of cabinets. FIG. 5 shows the arrangement of a plurality of cabinets, access from all sides being provided for each cabinet, while FIG. 6 shows an arrangement of a plurality of cabinets in which each cabinet is accessible only from two sides.

The invention has been described in detail with particular reference to preferred embodiments thereof and examples, but it will be understood that variations and modifications can be effected within the spirit and scope of the invention.

What is claimed is:

1. A cabinet for accommodating electronic subassemblies and distribution components, comprising: four upright supports, which are connected to one another at the top and bottom in each case, for fixing the subassemblies and distribution components, the upright supports each having a comb-like limb that points obliquely outward and whose outer edge in each case forms an edge of the cabinet.

2. The cabinet as claimed in claim 1, wherein the cabinet has a square cross section.

3. The cabinet as claimed in claim 2, wherein at the top and bottom, each support has hinge devices for a door.

4. The cabinet as claimed in claim 1, wherein at the top and bottom, each support has hinge devices for a door.

5. The cabinet as claimed in claim 4, wherein the cabinet has four doors.

* * * * *